United States Patent
Shibata

(10) Patent No.: US 7,091,591 B2
(45) Date of Patent: Aug. 15, 2006

(54) SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 277 days.

(21) Appl. No.: 10/754,605

(22) Filed: Jan. 12, 2004

(65) Prior Publication Data

US 2004/0140555 A1 Jul. 22, 2004

Related U.S. Application Data

(62) Division of application No. 10/255,961, filed on Sep. 27, 2002, now Pat. No. 6,727,582.

(30) Foreign Application Priority Data

Sep. 28, 2001 (JP) .............................. 2001-302288

(51) Int. Cl.
*H01L 23/02* (2006.01)
(52) U.S. Cl. .................. 257/686; 257/E23.169
(58) Field of Classification Search ................ 257/678, 257/685, 686, 723, 777, 778, E23.001, E23.141, 257/E23.169, E27.001
See application file for complete search history.

(56) References Cited

U.S. PATENT DOCUMENTS 5,798,567 A * 8/1998 Kelly et al. ................. 257/723
6,215,182 B1 * 4/2001 Ozawa et al. ............... 257/723
6,239,495 B1 * 5/2001 Sakui et al. ................. 257/777
6,351,391 B1 * 2/2002 Beliveau et al. ............ 361/767
6,365,975 B1 * 4/2002 DiStefano et al. .......... 257/777
6,392,292 B1 * 5/2002 Morishita .................... 257/686
6,424,034 B1 * 7/2002 Ahn et al. ................... 257/723
6,444,576 B1 * 9/2002 Kong .......................... 438/667

FOREIGN PATENT DOCUMENTS

| JP | 05-160336 | * | 6/1993 |
| JP | 07-176684 | * | 7/1995 |
| JP | 2000-311982 | * | 11/2000 |

* cited by examiner

*Primary Examiner*—Scott B. Geyer
(74) *Attorney, Agent, or Firm*—Rabin & Berdo P.C.

(57) ABSTRACT

A semiconductor device formed by mutually connecting a first semiconductor chip with second and third semiconductor chips arranged side by side, with the active surface of the first chip faced to those of the second and third chip. Both the second and third semiconductor chips have functional elements on their active surface. The first semiconductor chip has, in its active surface, a wiring for connecting the second semiconductor chip and the third semiconductor chip, and a terminal for external connection on its surface opposite to its active surface.

4 Claims, 3 Drawing Sheets

SEMICONDUCTOR DEVICE

This application is a divisional of application Ser. No. 10/255,961, which was filed on Sep. 27, 2002, now U.S. Pat. No. 6,727,582, issued Apr. 27, 2004.

BACKGROUND OF THE INVENTION

1. Field of the Invention

The present invention relates to a semiconductor device having a chip-on-chip structure having semiconductor chips stacked, on their surface, with other semiconductor chips.

2. Description of Related Art

There is a multi-chip module that is one form of semiconductor devices intended to improve the transmission speed of the signals at between devices. In the multi-chip module, a plurality of semiconductor chips are mounted on a circuit board in one package. By shortening the wiring connecting between the semiconductor chips, high speed transmission of a signal is achieved. A plurality of semiconductor chips forming functional elements are mounted on the circuit board, wherein each semiconductor chip is connected face down on the circuit board (flip-chip connection). The circuit board, usually, uses an insulating board formed with multiple levels of wiring thereon. Namely, the circuit board includes the wiring on a surface layer, the wiring on inner levels, and the wiring of inter-level connection.

The semiconductor chip mounted on the circuit board in a certain case is further stacked with other semiconductor chips thereby forming a chip-on-chip structure.

In the multi-chip module thus structured, by shortening the length of the wiring connecting between the circuit board and the semiconductor chip and between the semiconductor chips in the circuit board, it is hoped that high speed transmission of signals between the functional elements formed on the semiconductor chips will be realized. Also, because connection is possible to another circuit board through the bumps provided at the underside of the circuit board, the wiring length for external connection is comparatively short thus making it possible to externally transmit a signal with a certain degree of speed.

However, in the multi-chip module, the wirings on the circuit board are greater in width and pitch as compared to the wiring made by the semiconductor process. Consequently, in order to mount semiconductor chips with high density on the circuit board, there is a need to increase the number of levels of wirings in order for preventing against interference between the wirings, resulting in an increased wiring length. This makes it impossible to sufficiently increase the transmission speed of signals.

Meanwhile, the semiconductor chips are externally connected through the circuit board using an insulating substrate and hence the possible wiring-length reduction is limited. This makes it impossible to sufficiently increase the signal transmission speed over the external connection.

SUMMARY OF THE INVENTION

It is an object of the present invention to provide a semiconductor device capable of increasing the transmission speed of the signal.

A semiconductor device of the present invention is a semiconductor device structured by mutually connecting a first semiconductor chip to second and third semiconductor chips arranged side by side, with their active surfaces faced to each other. The second and third semiconductor chips respectively have functional elements in their active surface. The first semiconductor chip is wired on its active surface to the second and third semiconductor chips, and a terminal for external connection on the surface opposite to the active surface.

Because the wiring of the first semiconductor chip is formed by a semiconductor process, the wire width and interval between wires can be made 1 μm or smaller, for example. On a circuit board using an insulating substrate, the wire width and interval between wires is several tens to several hundreds of μm. As compared to this, the wiring by the semiconductor process is more precise by far. Due to this, the wiring on the first semiconductor chip, even in multi-levels, can be made in a short length. Accordingly, the second semiconductor chip and the third semiconductor chip can be connected (internally through the first semiconductor chip) together with a short length of wire.

Meanwhile, the first semiconductor chip has a terminal for external connection on the surface opposite to the active surface. The terminal for external connection can be made by a bump formed by a solder ball or the like. Using the terminal for external connection, surface mounting can be made onto another circuit board. Accordingly, because the semiconductor chips can be externally connected through a short distance without interposing a circuit board, the semiconductor device has a high external signal transmission speed.

As described above, the semiconductor device structured as above can have a short wiring length in both internal and external connections, hence making it possible to increase the transmission speed of the signal.

The first semiconductor chip may be connected with another semiconductor chip besides the second and third semiconductor chips. Also, the second or third semiconductor chip may be vertically stacked and connected thereon with another semiconductor chips.

By structuring the first to third semiconductor chips of the same kind of semiconductor material (e.g. silicon), these can be made coincident in their thermal expansion coefficients. Thus, it is possible to avoid the stresses from occurring due to a difference in thermal expansion/contraction.

The first semiconductor chip may have a functional element on its active surface.

By providing the first semiconductor chip with a function in addition to its role as a circuit board, it is possible to provide a dense arrangement of the semiconductor chips having functional elements. This realizes size reduction and functional improvement of the semiconductor device.

Meanwhile, by providing a functional element on the first semiconductor chip, the functional elements are rendered in a state arranged uniformly in the first to third semiconductor chips, thus shortening the mean wiring length. Namely, the first semiconductor chip is provided with wiring connecting the functional elements of the first semiconductor chip and connecting the functional elements of the first semiconductor chip and the functional elements of the second or third semiconductor chip. Most of the wirings are short as compared to the wiring connecting the functional elements of the second and third semiconductor chips.

This makes short the overall wiring length as compared to the case connecting the functional elements of the semiconductor chips arranged side by side as in the conventional multi-chip module. This further improves signal transmission speed.

The first semiconductor chip may have a through-hole.

The through-hole provided in the first semiconductor chip can be provided, therein, with a conductor. In this case, short distance connection is possible between the wiring on the active surface and the terminal for external connection through the conductor within the through-hole. This structure further increases signal transmission speed to and from the outside.

The through-hole, at its inside, may be filled with a conductor by using a conductor paste. In such a case, a terminal for external connection may be provided immediately beneath the through-hole. This makes minimal the distance of between the wiring on the active surface and the terminal for external connection (nearly equal to a thickness of the first semiconductor chip). There is no need to connect all the wirings on the active surface of the first semiconductor chip to the terminal for external connection through the through-hole. It is possible to selectively connect the wiring required for high-speed signal transmission by the through-hole to the outside.

The second and third semiconductor chips each may have a wiring connecting internal functional elements. In this case, the wires in the first semiconductor chip are preferably greater in sectional area than the wiring on the third semiconductor chip.

The wiring of the first semiconductor chip, formed by the semiconductor process, is narrow in width. The wires, when made small in sectional area, have an increased resistance per unit area, thus increasing the overall wiring resistance. According to the above structure, the wiring of the first semiconductor chip is greater in sectional area than the wiring of the second or third semiconductor chip. Accordingly, because the wiring of the first semiconductor chip is low in resistance per unit length, the overall wiring resistance is low in the first semiconductor chip. This structure can provide the first semiconductor chip with excellent function as a circuit board. There is no need to provide the same sectional area to all the wires in the first semiconductor chip, e.g. the longer wiring may be selectively increased in its sectional area.

In order to increase the sectional area of the wiring of the first semiconductor chip greater than the wiring of the second or third semiconductor chip, it is possible to increase the width or thickness thereof.

The above and other objects, features and effects of the present invention will be more apparent from the ensuing embodiment to be explained referring to the accompanying drawings.

DESCRIPTION OF THE PREFERRED EMBODIMENTS

Figure 1:
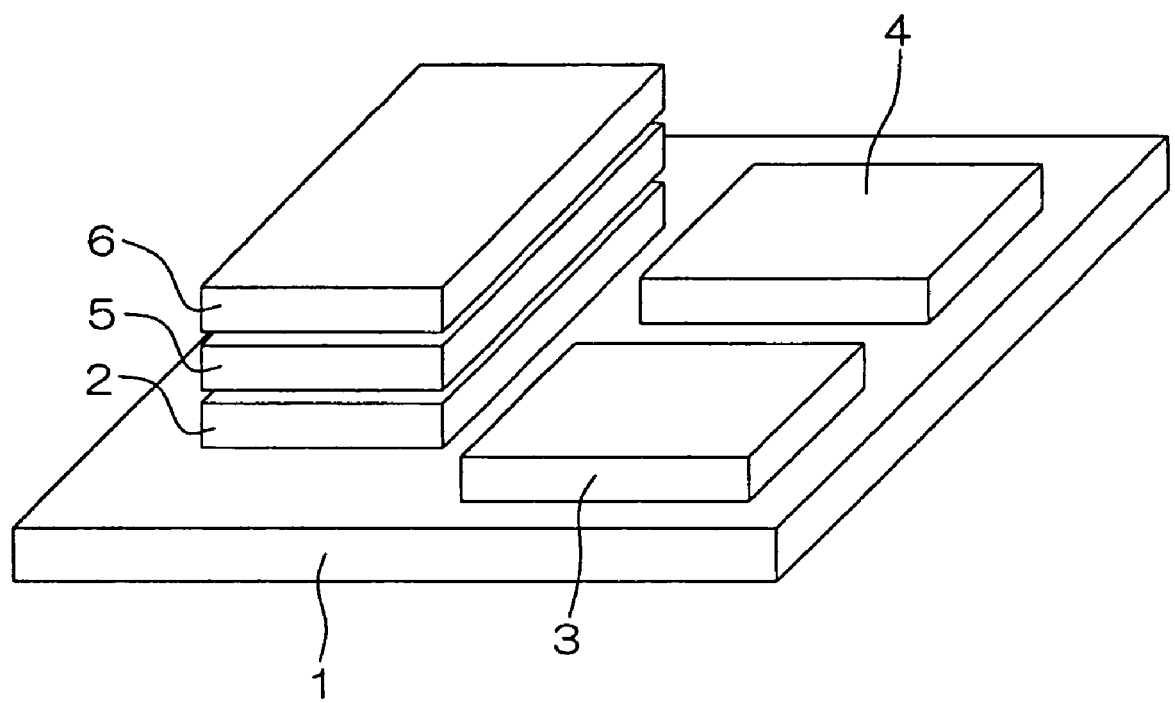
FIG. 1 is an illustrative perspective view of a semiconductor device according to one embodiment of the present invention.

FIG. 1 is an illustrative perspective view of a semiconductor device according to an embodiment of the present invention.

A large-sized semiconductor chip (parent chip) 1 is connected thereon with smaller semiconductor chips (child chips) 2, 3, 4 mutually arranged side by side. The child chip 2 is further vertically stacked and connected with child chips 5, 6 that are nearly the same in size as the child chip 2.

Figure 2:
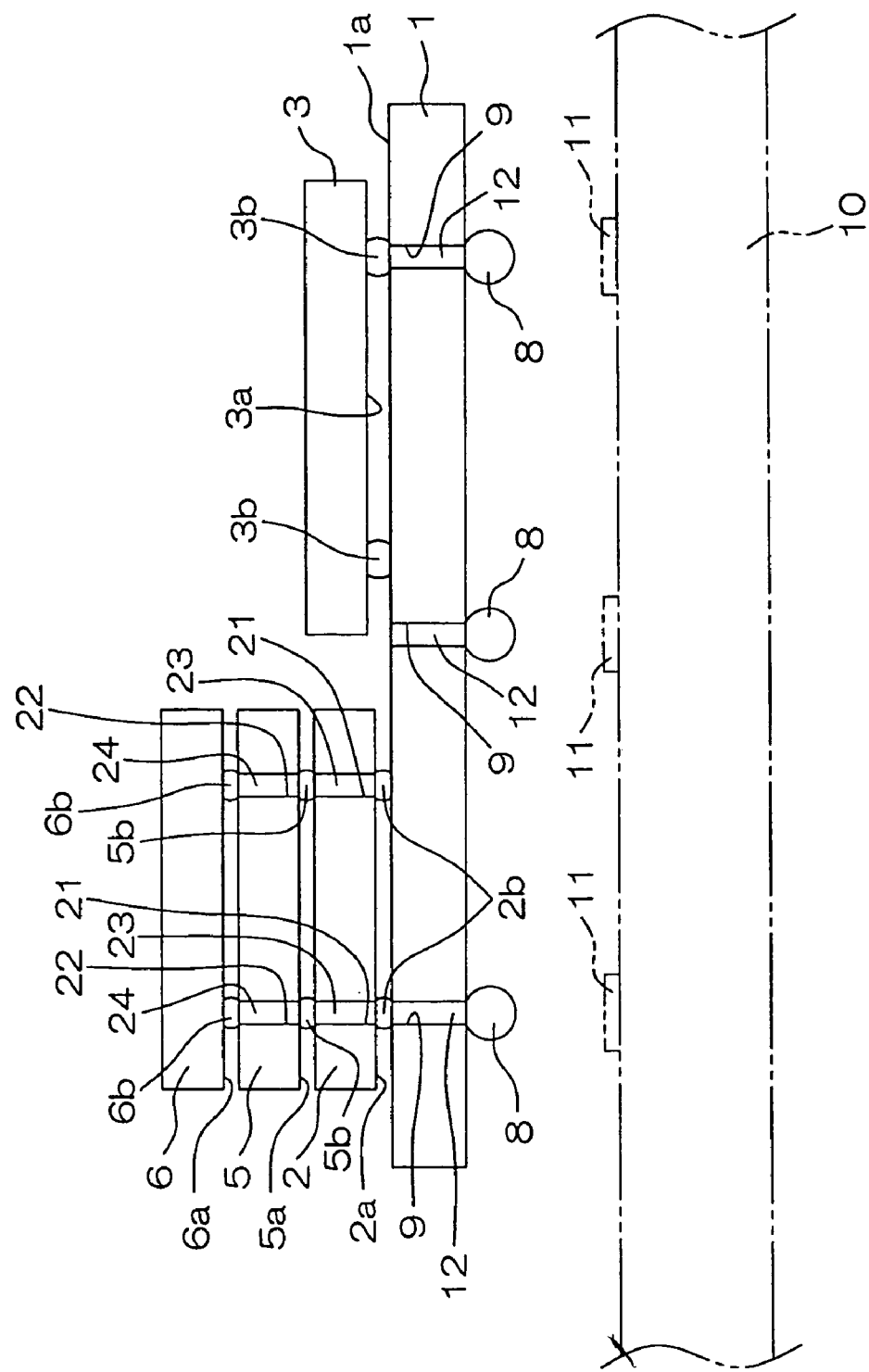
FIG. 2 is an illustrative sectional view of a semiconductor device of FIG. 1.
Figure 3:
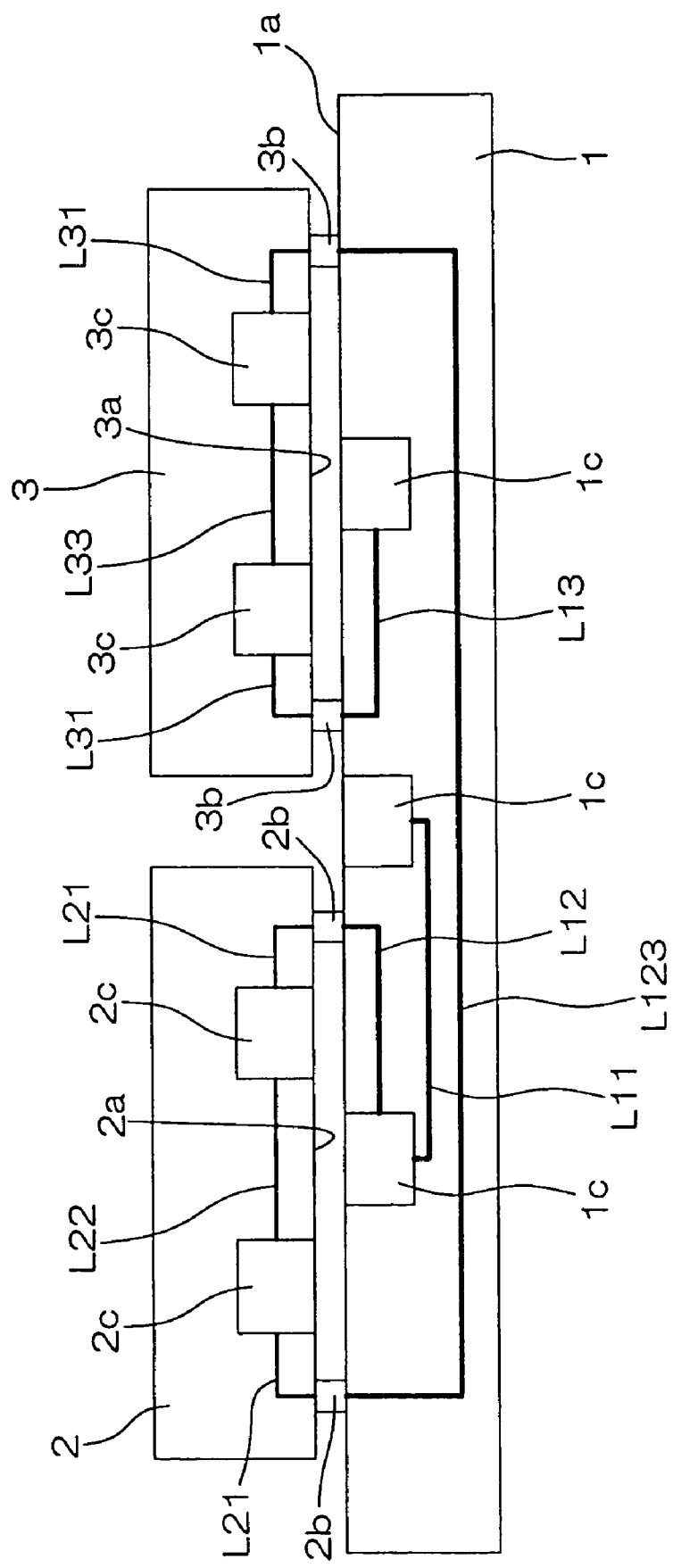
FIG. 3 is an illustrative sectional view showing the wirings on parent and child chips.

FIG. 2 is an illustrative sectional view of the child chips 2, 3, 5, 6 of the semiconductor device of FIG. 1. FIG. 3 is an illustrative sectional view showing the wirings of the parent chip 1 and child chips 2, 3.

Flip-chip connection is provided between the parent chip 1 and the child chips 2, 3 with their respective active surfaces 1a and 2a, 3a, positioned with the latter two facing the former. Namely, bumps 2b, 3b are respectively provided on the active surfaces 2a, 3a of the child chips 2, 3. By connecting the bumps 2b, 3b to the electrode pads (not shown) provided on the active surface 1a of the parent chip 1, the child chips 2, 3 are connected on the parent chip 1 in a mechanical and electrical fashion. The parent chip 1 and child chips 2, 3, have functional elements 1c, 2c, 3c formed on the active surfaces 1a, 2a, 3a, respectively.

On the active surface 1a, there are formed a wiring L11 connecting the functional elements 1c of the parent chip 1c, a wiring L12 for connecting a functional element 1c of the parent chip 1 and the child chip 2, 3, and a wiring L123 connecting the child chip 2 and the child chip 3.

On the active surface 2a, there are formed a wiring L22 connecting between the functional elements 2c of the child chip 2, and a wiring L21 for connecting a functional element 2c of the child chip 2 to the parent chip 1. On the active surface 3a, there are formed a wiring L33 connecting the functional elements 3c of the child chip 3, and a wiring L31 for connecting a functional element 3c of the child chip 3 and the parent chip 1.

The functional element 1c of the parent chip 1 and the functional element 2c of the child chip 2 are connected together by the wiring L12, the bump 2b and the wiring L21. The functional element 1c of the parent chip 1 and the functional element 3c of the child chip 3 are connected together by the wiring L13, the bump 3b and the wiring L31. The functional element 2c of the child chip 2 and the functional element 3c of child chip 3 are connected together by the wiring L21, the bump 2b, the wiring L123, the bump 3b and the wiring L31.

The wirings L11, L12, L13, L123 of the parent chip 1 are formed with wires greater in width and thickness of cross section than the wirings L21, L22, L31, L33 of the child chip 2, 3, and so greater in sectional area than the wirings L21, L22, L31, L33 of the child chip 2, 3. Namely, design rule of the parent chip 1 is different from that of the child chip 2, 3.

The parent chip 1 has a through-hole 9 penetrating through the parent chip 1 in the thickness direction. A conductor 12 is filled in the through-hole 9. The conductor 12 can be a conductor paste, for example. A bump 8, a terminal for external connection, is provided beneath the through-hole 9. The bump 8 can consist, for example, of a solder ball. The wirings L11, 112, L13, L123 and the bump 8 are electrically connected by the conductor 12, and provided immediately beneath the junction between a part of the through-hole 9, the parent chip 1 and the child chip 2, 3.

The child chips 2, 5 respectively have through-holes 21, 22 penetrating through the child chip 2, 5 in the thickness direction. Conductors 23, 24 are respectively filled in the through-holes 21, 22. The child chips 5, 6 have, at their lower surface, an active surface 5a, 6a formed with functional elements and wirings. On the active surfaces 5a, 6a, bumps 5b, 6b are respectively provided in positions immediately above the conductors 23, 24. The bumps 5b, 6b and the conductors 23, 24 are respectively joined together through an electrode pad (not shown) formed above the conductor 23, 24. This electrically connects the child chip 2 and the child chip 5 and connects the child chip 5 and the child chip 6.

In the semiconductor device thus structured, the parent chip 1 and the child chips 2, 3 are connected through the bumps 2b, 3b. A functional element 2c of the child chip 2 and a functional element 3c of the child chip 3 are connected through the wiring L123 formed on the active surface 1a of the parent chip 1. The wiring L123 of the parent chip 1 can be made with a wire width and interval between wires, for example, of 1 µm or smaller because it is provided by a semiconductor process. A circuit board using an insulating substrate has a wiring width and spacing of nearly several tens to several hundreds µm, in comparison with which the wiring made by a semiconductor process is far more fine. Due to this, the wiring L123 on the parent chip 1 can be reduced in length even in a multi-level form. Thus, the child chip 2 and the child-chip 3 can be connected together (internally through the parent chip) through a short wiring.

Meanwhile, the parent chip 1 possesses the functional element 1c whereby the functional elements 1c, 2c, 3c are evenly distributed in the parent chip 1 and the child chips 2, 3. This makes it possible to shorten the mean wiring length between the elements. Namely, the parent chip 1 is provided with the wirings L11, L12, L13 to connect the functional elements 1c in the parent chip 1 and connect functional elements 1c of the parent chip 1 and functional elements 2c, 3c of the child chips 2, 3. Most of the wirings L11, L12, L13 have a shorter length than that of the wiring L123 connecting between the functional elements 2c, 3c of the child chips 2, 3. This reduces the overall wiring length as compared to the case where the functional elements of semiconductor chips are arranged side by side.

Connection is provided-between the wirings L11, L12, L13, L123 and the bumps 8 which are terminals for external connection, through the conductors 12 inside the through-holes 9. This reduces the wiring length between them. The semiconductor device can be surface-mounted on a circuit board 10 by the use of the bumps 8 of the parent chip 1. The bumps 8 can be respectively connected to the connection pads 11 provided on the circuit board 10. Consequently, it is possible to connect together the parent chip 1 and the child chips 2, 3 through a short external wiring.

As described above, the semiconductor device is short in wiring length in both internal and external connections. Consequently, because signal transmission speed is high in both the internal and to the external connections, signal transmission speed can be increased over the entire semiconductor device.

The structure of the child chip 4 (see FIG. 1) and the connection form thereof to the parent chip 1 are similar to those of the child chips 2, 3. Accordingly, the child chip 4 can also be externally connected with a short wiring.

By forming the parent chip 1 and child chips 2, 3 of a semiconductor material in a similar kind (e.g. silicon), these can be made coincident in thermal expansion coefficient. This can avoid against the deterioration at the junctions due to stresses caused by a difference in thermal expansion/contraction rate.

The wiring L11, L12, L13, L123 of the parent chip 1 is greater in width and thickness in cross section as compared to the wirings L21, L22, L31, L33 of the child chip 2, 3, and hence is low in resistance per unit length. Accordingly, the wiring L11, L12, L13, L123 of the parent chip 1, despite including the long wiring L123 connecting between the child chips 2, 3, has a low resistance overall.

The wiring L11, L12, L13, L123 of the parent chip 1 may be the same in thickness but greater only in width or the same in width but greater only in thickness, as compared to the wiring L21, L22, 31, L33 of the child chip 2, 3. Further, the wiring L12, L13, L123 of the parent chip 1 is not necessarily constantly greater in width or (and) thickness, as compared to the wiring L21, L22, L31, L33 of the child chip 2, 3. For example, only the long wiring L123, connecting between the functional element 2c of the child chip 2 and the functional element 3c of the child chip 3, may be made greater in width or (and) thickness. This can efficiently reduce the mean resistance value of the wirings L11, L12, L13, L123 of the parent chip 1.

The bump 8 need not be arranged immediately beneath the through-hole 9. In such case, a wiring may be provided on the surface opposite to the active surface 1a to connect between the conductor 12 of the through-hole 9 and the bump 8. In this case, the through-hole at the inside need not be completely filled with the conductor 12. For example, a conductive film, such as by plating, may be formed on the inside surface of the through-hole 9.

In order to protect the active surface 1a of the parent chip 1 and the child chips 2, 3, 4, 5, 6, resin sealing may be provided on a region including them.

Although the embodiments of the invention were explained in detail, these are mere concrete examples for use in setting forth the technical subject matter of the invention. The invention is not to be construed limited to the detailed examples, but rather the sprit and scope of the invention is to be limited only by the accompanying claims.

This application corresponds to Japanese Patent Application No. 2001-302288 filed with Japanese Patent Office Sep. 28, 2001, and all the disclosure of that application is incorporated herein by reference.

What is claimed is:

1. A semiconductor device, comprising:
   a first semiconductor chip having an active first chip surface and a non-active first chip surface;
   a second semiconductor chip bonded to the active first chip surface of the first semiconductor chip, the second semiconductor chip having an active second chip surface and a non-active second chip surface, the active second chip surface facing the active first chip surface of the first semiconductor chip;
   a third semiconductor chip bonded to the non-active second chip surface of the second semiconductor chip, the third semiconductor chip having an active third chip surface and a non-active third chip surface, the active third chip surface facing the non-active second chip surface of the second semiconductor chip;
   a wiring, provided within a through hole formed in the second semiconductor chip, for electrically connecting the second semiconductor chip and the third semiconductor chip; and
   a terminal for external connection provided on the non-active first chip surface of the first semiconductor chip.

2. A semiconductor device according to claim 1, further comprising:
   a fourth semiconductor chip bonded to the non-active third chip surface of the third semiconductor chip, the fourth semiconductor chip having an active fourth chip surface and a non-active fourth chip surface, the active fourth chip surface facing the non-active third chip surface of the third semiconductor device; and
   another wiring, provided within a through hole formed in the third semiconductor chip, for electrically connecting the third semiconductor chip and the fourth semiconductor chip.

3. A semiconductor device, comprising:
   a first semiconductor chip having an active first chip surface and a non-active first chip surface; and a plurality of second semiconductor chips stacked one onto another, each of the plurality of second semiconductor chips having an active second chip surface facing toward the active first chip surface of the first semiconductor chip;

the plurality of second semiconductor chips including a lowermost second semiconductor chip having the active second chip surface thereof bonded to the active first chip surface of the first semiconductor chip;

a wiring, provided within a through hole formed in the lowermost second semiconductor chip, for electrical connection between the lowermost second semiconductor chip and another one of the second semiconductor chips stacked on the lowermost second semiconductor chip.

4. A semiconductor device according to claim 3, wherein the plurality of second semiconductor chips further includes a topmost second semiconductor chip stacked at the top of the plurality of second semiconductor chips, the topmost second semiconductor chip being free from any through hole within which a wiring member is provided.

* * * * *